(12) United States Patent
Neumann et al.

(10) Patent No.: US 7,352,872 B2
(45) Date of Patent: Apr. 1, 2008

(54) FILTER CIRCUIT AND METHOD FOR PROCESSING AN AUDIO SIGNAL

(75) Inventors: Wolfgang Neumann, Niederkrüchten (DE); Hermann Gier, Niederkrüchten (DE)

(73) Assignee: SPL Electronics GmbH, Niederkruchten (DE)

( * ) Notice: Subject to any disclaimer, the term of this patent is extended or adjusted under 35 U.S.C. 154(b) by 463 days.

(21) Appl. No.: 10/483,780

(22) PCT Filed: Jul. 10, 2002

(86) PCT No.: PCT/EP02/07703

§ 371 (c)(1),
(2), (4) Date: May 10, 2004

(87) PCT Pub. No.: WO03/009469

PCT Pub. Date: Jan. 30, 2003

(65) Prior Publication Data

US 2004/0179700 A1    Sep. 16, 2004

(30) Foreign Application Priority Data

Jul. 18, 2001  (DE) ................................. 101 34 927

(51) Int. Cl.
*H03G 5/00* (2006.01)
*H03G 3/00* (2006.01)
*H04B 1/00* (2006.01)

(52) U.S. Cl. .......................... 381/98; 381/61; 381/101; 381/103; 381/119

(58) Field of Classification Search ................ 381/119, 381/98, 101–104, 118, 61, 94.3, 63, 107, 381/109, 96, 120
See application file for complete search history.

(56) References Cited

U.S. PATENT DOCUMENTS

| 4,422,048 | A |   | 12/1983 | Edwards |          |
|-----------|---|---|---------|---------|----------|
| 4,432,097 | A | * | 2/1984  | Okada et al. | 381/98 |
| 4,709,391 | A | * | 11/1987 | Kaizer et al. | 381/98 |
| 5,046,105 | A | * | 9/1991  | Bohn    | 381/98   |
| 6,163,789 | A | * | 12/2000 | Liu     | 708/323  |
| 6,792,119 | B1 | * | 9/2004 | Aarts   | 381/98   |

\* cited by examiner

*Primary Examiner*—Vivian Chin
*Assistant Examiner*—Douglas Suthers
(74) *Attorney, Agent, or Firm*—Duane Morris LLP

(57) ABSTRACT

The invention relates to a filter circuit for processing an audio signal, comprising a first branch in which the audio signal is guided in an essentially unchanged state to an output summation stage, and a second branch comprising several series-connected filter stages. The audio signal is inputted into a first filter stage of the series-connected filter stages and guided via said stages to an output summation stage. The second branch comprises several secondary branches via which the audio signal is directly guided to further filter stages of the series-connected filter stages. At least one of the filter stages is adjustable and adjusting one filter stage has an impact on the function of another filter stage.

23 Claims, 3 Drawing Sheets

FILTER CIRCUIT AND METHOD FOR PROCESSING AN AUDIO SIGNAL

The invention relates to a filter circuit and a method for processing an audio signal which are suitable for handling audio signals over the entire usual transmission bandwidth, approximately 10 Hz to 50 kHz, in such a way that the result is an improved, more pleasant tone. Such filter circuits are also know as equilizers and are used in the form of analog circuits, for example in audio mixing desks for amplifying and/or recording music and also in appliances in consumer electronics, information technology and telecommunication.

The filters known today are usually scaled to a selectable frequency range in the audio transmission bandwidth. Connecting a plurality of such filters in a cascade forms an equalizer which covers the entire audio frequency spectrum and which processes an audio signal in such a way that the result is a desired tonal effect and, in particular, a pleasant tonal action. Each individual filter can contain controls or adjustment options for the bandwidth, the frequency, the gain or suppression (boost/cut) and the like, and these controls or adjustment options each have an effect on the corresponding parameters of the associated filter. The filters in the equalizer are independent of one another, i.e. the adjustment of one filter does not affect the adjustment of another filter.

Various filter types and options for implementing them are known. In principle, the function of a filter is to attenuate particular frequency components or ranges of a signal or to transmit them with preference. Filters are distinguished, according to the type of signal processed in the filter, as analog filters or digital filters, in terms of the implementation of the circuitry, as reactance filters, active filters or monolithic filters, in terms of the frequency range in the frequency interval, e.g. as low-pass filters, high-pass filters, bandpass filters, allpass filters and band-rejecting filters, and in terms of the transfer function and pulse response, as recursive filters or nonrecursive filters, particularly transversal filters or FIR filters. The principles of filter technology are described, by way of example, in Prof. Manfred Seifert: Analoge Schaltungen, Verlag Technik GmbH, 1994. Further background to the design of filter circuits can be found, by way of example, in Arthur B. Williams, Fred J. Taylor: Electronic Filter Design Handbook, Mc Graw-Hill Book Company, 1988; E. Zwicker, M. Zollner: Elektroakustik, [Electro-acoustics], Springer Verlag, 1987; U. Titzer, Ch. Schenk: Halbleiter-Schaltungstechnik [Semiconductor Circuitry], Springer Verlag, 1999.

Filter circuit for processing analog or digital signals are used in the prior art wherever loudspeakers for reproducing tone, such as speech or music, are used. The filter circuit normally has an output stage, amplifier, and a tone transducer, loudspeaker, connected downstream of it. The usual types of use for the filter circuits from the prior art and for the filter circuit in line with the invention are in consumer electronics, such as in radios, radio receivers, satellite receivers, television receivers, Playstations and the like, in IT technology, such as in sound cards for computers, and in telecommunication technology, such as in mobile telephones and telephone terminals. The filter circuit can also be used in audio mixing desks and the like, however.

The invention is based on the object of specifying a novel filter circuit and a method for processing an audio signal which are able to process input signals in the entire frequency range which is usual for transmitting audio signals, approximately from 10 Hz to 50 kHz, and to process and equalize the incoming audio signals in such a way that the result is a pleasant aural impression.

This object is achieved by a filter circuit having the features of claim 1 and by a method having the features of claim 11.

The invention makes provision for a filter circuit and a method for processing an audio signal which are constructed from a plurality of individual filters logically combined with one another. A number of different filter stages are connected in series, the audio signal is input into the first filter stage from the series-connected filter stages and is routed via the series circuit to an output on the filter circuit. At the same time, the audio signal is input directly, that is to say bypassing the first, second etc. filter stages, into the further filter stages as an additional input signal and is routed essentially unprocessed to the output. At the output, the essentially unprocessed audio signal and also the output signal from the series-connected filter stages are summed. The individual filter stages are logically combined with one another in such a way that they affect one another, which means that changing one filter stage also affects the response of the subsequent filter stages. The inventive logic combination of the individual filter stages means that adjusting individual parameters of selected filter stages can be used to achieve interactive interaction between the filter stages, which allows the audio signal to be influenced as desired in order to produce a desired aural impression. When the processed audio signal is then logically combined with the essentially unprocessed audio signal in a summing stage, the result is an adjustable equalization curve which is used to emphasize or raise particular frequency ranges and at the same time to lower other frequency ranges in a desired ratio thereto. The interaction of the individual filter stages allows not only the pure frequency/amplitude processing but also a phase shift in the audio signal on the basis of the amplitude. The inventive filter circuit preferably operates in the frequency range from 10 Hz to 50 kHz, particularly 20 Hz to 22 kHz.

As a surprise, it has been found that the inventive logic combination of the filter stages and, in particular, the interaction of the filter stages with one another result in advantageous equalization and a pleasant aural impression when the output signal is routed via an electro-acoustic transducer. In the case of the filter circuit in line with the invention, the present aural impression is achieved, in particular, by improved bass staggering in the tone, increased separation of the instrumentation, an improvement in clarity and transparency of the tones and also a subjective increase in loudness.

The inventive filter circuit can be produced both by an analog circuit and by a programmed digital algorithm. The filter can thus be implemented in software, firmware or hardware.

In principle, the invention splits the audio input signal into two paths: the first path is used to route the audio signal as a reference signal in essentially unprocessed form, in a ratio of 1:1, to a non-inverting input on an output summing stage. The second path is preferably routed via a regulatable amplifier stage whose output signal is used as a primary amplitude control for all subsequent filter stages. The output signal from the regulatable amplifier stage is supplied to a plurality of subsidiary paths, with the inputs of the subsidiary paths each having resistors which weight the audio signal and distribute it over the various filter stages.

Optionally, the first path can have a switching function or a switch for turning off the reference signal for the summing stage. The result of this is that only the audio signal routed in the second path is available at the output of the filter circuit. This signal can then be admixed with the its original audio signal or with the reference signal at another point, e.g. in an audio mixing desk using auxiliary paths.

The filter stages connected in series in the second path preferably comprise a control filter, a modified bandpass filter and a modified universal filter which are connected in series in this order. The control filter is in the form of an active area adjuster. An area adjuster is basically a filter which regulates bass and treble, with the frequencies for the bass and treble being firmly preset and the amplitudes for bass and treble being regulatable. In line with the invention, the control filter is in a form such that, for a relatively high frequency range, its frequency and amplitude are firmly set and, for a relatively low frequency range, it has a fixed frequency and a variable amplitude, with the variable amplitude being able to be adjusted using a control.

The output signal from the control filter is supplied to the modified bandpass filter, with the bandpass filter receiving, as a further input signal, the essentially unprocessed audio signal via a further, weighted subsidiary path. This modified bandpass filter emphasizes the low frequency range of the audio signal and acts like a frequency-dependent resistor to ground, which reaches its maximum at a desired frequency, e.g. 50 Hz.

The output signal from the series circuit comprising the control filter and the modified bandpass filter is supplied to a control input on the modified universal filter. Controls provided in the control filter and the summation of the functions of the control filter and modified bandpass filter prompt frequency and phase regulation of the bass range at the input of the modified universal filter. The action of these two filters together is thus different in combination than if just a respective one of the filters were present or if the filters were decoupled from one another.

The modified universal filter is adjusted via two signal paths: the summed output signal from the control filter and the bandpass filter actuates the noninverting input of a first integrator stage, operating as a low-pass filter, via a voltage divider. The low-pass filter has a bandpass filter and a high-pass filter connected downstream of it, with the low-pass filter, the bandpass filter and the high-pass filter being combined overall such that they comprise a first and a second integrator stage, which is discussed in more detail further below.

The second actuation path comes via a further subsidiary path with the essentially unprocessed audio signal via the noninverting input of an amplifier stage. The output of this amplifier stage is connected via a node to the noninverting input of the high-pass filter stage in the modified universal filter, to which a control is also connected. This node is routed via a further control to the output of the universal filter, which is connected to an inverting input of the output summing stage.

The first control mentioned can be used to adjust the bandwidth of the universal filter, said bandwidth determining the frequency range for lowering and raising the mids/treble. The second control can be used to ramp up the output signal from the universal filter to the summing stage. This control can also be called a process control.

In line with the invention, a further subsidiary path can contain a treble and harmonic filter which receives the essentially unprocessed audio signal and whose output is connected to the noninverting input of the output summing stage.

The inventive distribution of the audio signal over the filter stages and of the filter output signals and of the reference signal over the inverting and noninverting inputs of the output summing stage results in interaction of the frequency and phase of the audio signal at the output of the adder. This interaction, additionally extended by controls and/or switches and also adjusters in the individual filter stages, determines the frequency equalization, or tone filter curves, of the inventive filter circuit.

Whereas comparable filter circuits or equalizers in the prior art used a plurality of filter stages connected in series or parallel which were essentially not intended to influence one another, the inventors have found a novel type of filter in which the interaction between the individual filter stages is deliberately used in order to achieve a desired equalization and tonal improvement. This filter, which is described as an analog filter circuit, can also be implemented as a digital filter in a computer program in the same way.

The invention is explained in more detail below using a preferred embodiment with reference to the drawing, in whose figures:

FIG. 1 shows a preferred embodiment of the inventive filter circuit in the form of a schematic block diagram.

Figure 1:
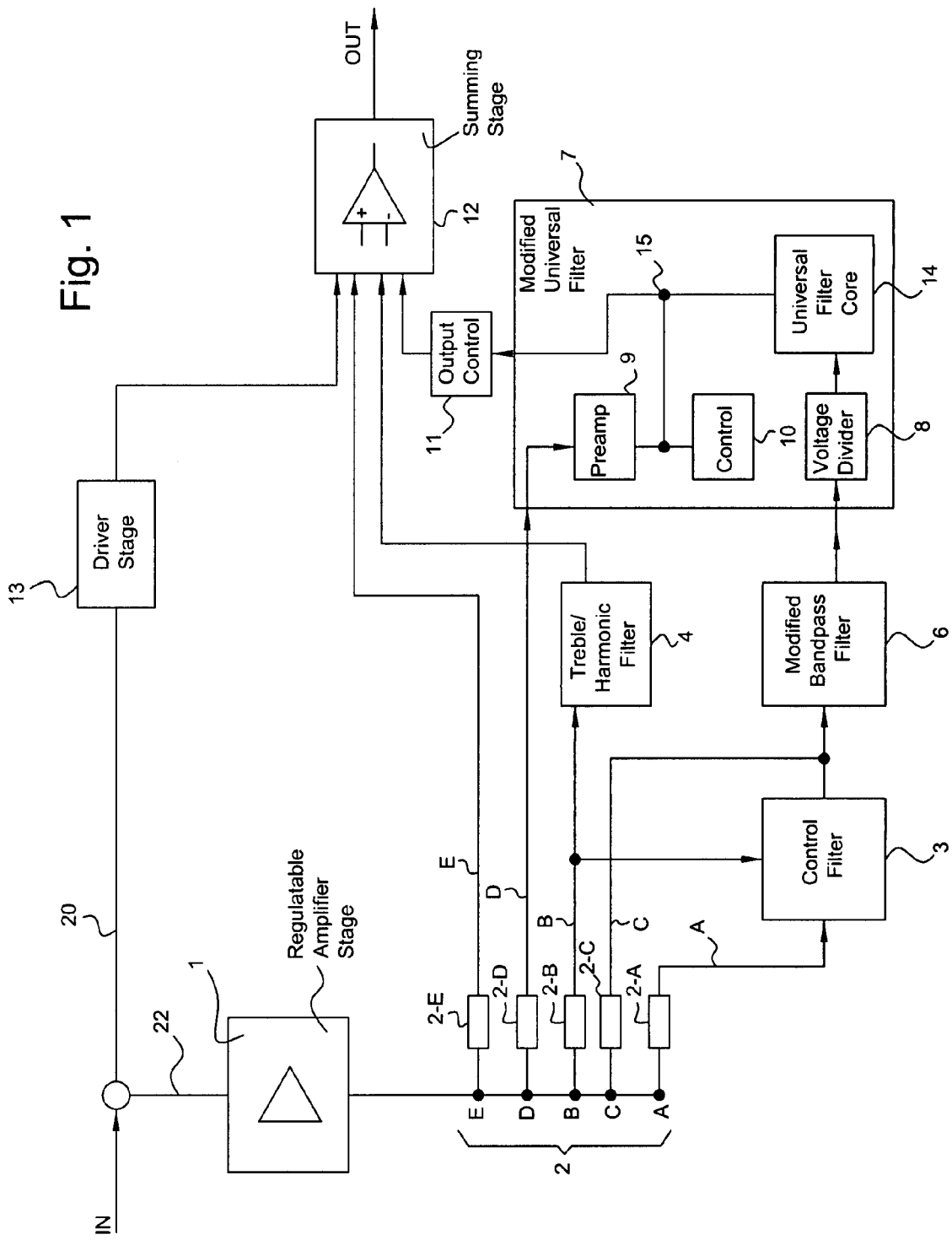
FIG. 1 shows a schematic block diagram of a preferred embodiment of the inventive filter circuit.

In FIG. 1 an audio input signal is denoted by in and an audio output signal is denoted by out. The audio input signal in is split into two paths 20, 22, with the first path 20 being able to be referred to as the reference path and the second path 22 being able to be referred to as the filter path. The reference path 20 has a 1:1 driver stage 13 which supplies the audio input signal in unprocessed to the noninverting input of a summing stage 12.

Connected to the input of the filter path 22 is a regulatable amplifier stage 1 which performs amplitude control for the audio input signal in for the subsequent filter stages, but otherwise does not process the audio input signal in further. The output signal from the regulatable amplifier stage 1 is split over a plurality of, in the embodiment shown five, (5), subsidiary paths via a plurality of parallel-connected resistors 2-A, 2-B, 2-C, 2-D, 2-E, the resistors being used to adjust the ratio of the subsidiary paths. As indicated by the "resistor" 2-D in FIG. 1, the resistors do not necessarily have to be provided in all subsidiary paths, so long as the desired ratio between the individual subsidiary paths is achieved. When the invention is implemented in software, the amplifier stage can be realized by multiplication and the resistors can be realized by appropriate weighting functions.

The reference path 20 can optionally (not shown) contain a switch or a switching function in order to interrupt this path, which means that the unprocessed and unamplified audio signal does not reach the summing stage 12. Only the filtered signal is then available at the output of the filter circuit, with the reference signal being able to be mixed with the filtered signal at another point, e.g. in an audio mixing desk using Aux send/return paths.

In the first subsidiary A, a control filter 3, a modified bandpass filter 6 and a modified universal filter 7 are connected in series in this order, with the output signal from the modified universal filter 6 being supplied to the inverting input of the summing stage 12. The second subsidiary path B contains an optional treble and harmonic filter 4 whose output signal is supplied to noninverting input of the summing stage 12. The input signal for the treble and harmonic filter 4 is also supplied to the control filter 3. The third subsidiary path C routes the essentially unprocessed audio signal together with the output signal from the control filter 3 to the input of the bandpass filter 6. The fourth subsidiary path D is used to supply the essentially unprocessed audio signal to the universal filter 7 directly. The fifth subsidiary path E is used to route the boosted-amplitude, but otherwise unprocessed, audio signal directly to a noninverting input on the summing stage 12.

The modified universal filter 7 basically comprises a first input stage having a voltage divider 8 which receives the output signal from the modified bandpass filter 6 and applies it to the input of the universal filter core 14. The modified universal filter 7 has a second input stage having a preamplifier 9, which second input stage receives the essentially unprocessed audio signal and having its output connected to a control 10 and to the universal filter core 14 via an output node 15. The node 15 is also routed to an output control 11 whose output is connected to the inverting input of the summing stage 0.12. As also explained in more detail below, the universal filter core 14 comprises a low-pass filter, a bandpass filter and a high-pass filter and covers the entire audible spectrum from 20 Hz to 22 kHz. In particular, the control 10 is used to set frequency ranges in the modified universal filter which are intended to be raised or lowered. By way of example, the control 10 can cover a bandwidth from approximately 1 kHz to approximately 22 kHz.

The control filter 3 and the modified bandpass filter 6 are used to actuate the universal filter 7 and, more specifically, the universal filter core 14. They have fixed dimensions for a particular frequency range and can be adjusted so as to vary for a further frequency range, as is explained in more detail with reference to FIG. 2. The bandpass filter 6 is constructed in the manner of a frequency-dependent resistor to ground and produces a bass frequency of approximately 50 Hz, as is likewise explained in more detail with reference to FIG. 2. As already mentioned, the control filter is in the form of an active area adjuster which, for a relatively high frequency range, has a fixed frequency and amplitude setting and, for a relatively low frequency range, has a fixed frequency setting and a variable amplitude setting.

The sum of the functions of these two filters is supplied to the first input stage 8 of the universal filter 7 or universal filter core 14, with the control, which can also be referred to as a bass tone control, which is present in the control filter 3 and the addition to the modified bandpass filter being able to be used to set a desired frequency equalization in the modified universal filter 7.

Put in simple terms, in this context the control filter 3 prompts frequency selection, the bandpass filter 6 prompts frequency addition in the base range and hence a frequency shift, and the control 10 in the universal filter 7 prompts frequency regulation.

By way of example, the modified universal filter can be used to amplify the frequency range from 20 to 150 Hz, approximately, to lower the frequency range from 150 to 500 Hz, approximately, and to amplify the frequency range beyond that again. The control 10 can set the range for lowering the frequency, e.g. to approximately 150 to 700 Hz (greatest bandwidth, smallest Q) or to other values which are desired, and the reduction can be stretched, by way of example, to up to 20 kHz, which means that only peak values above 20 kHz to approximately 22 kHz are amplified.

For the further handling of treble frequencies or to generate additional harmonics, the input signal can optionally be supplied to the treble and harmonic filter 4. The optional treble and harmonic filter 4 emphasizes the relatively high frequency range. As further options, a compressor/limiter for level control, a time correction stage or the like can be used in the subsidiary path B.

The first input stage of the universal filter 7 with the voltage divider 8 is an important circuit point in the inventive filter circuit for actuating and setting the universal filter. By integrating controls and/or connectable inductances at this control input, the universal filter can additionally make provision for further operations and circuit extensions for even further-reaching tone filtering.

At the output of the universal filter 7, a compressor/limiter, a time correction element or the like can again be provided, for example, for the further processing of the audio signal.

The inventive filter circuit is explained in more detail below with reference to FIG. 2.

Figure 2:
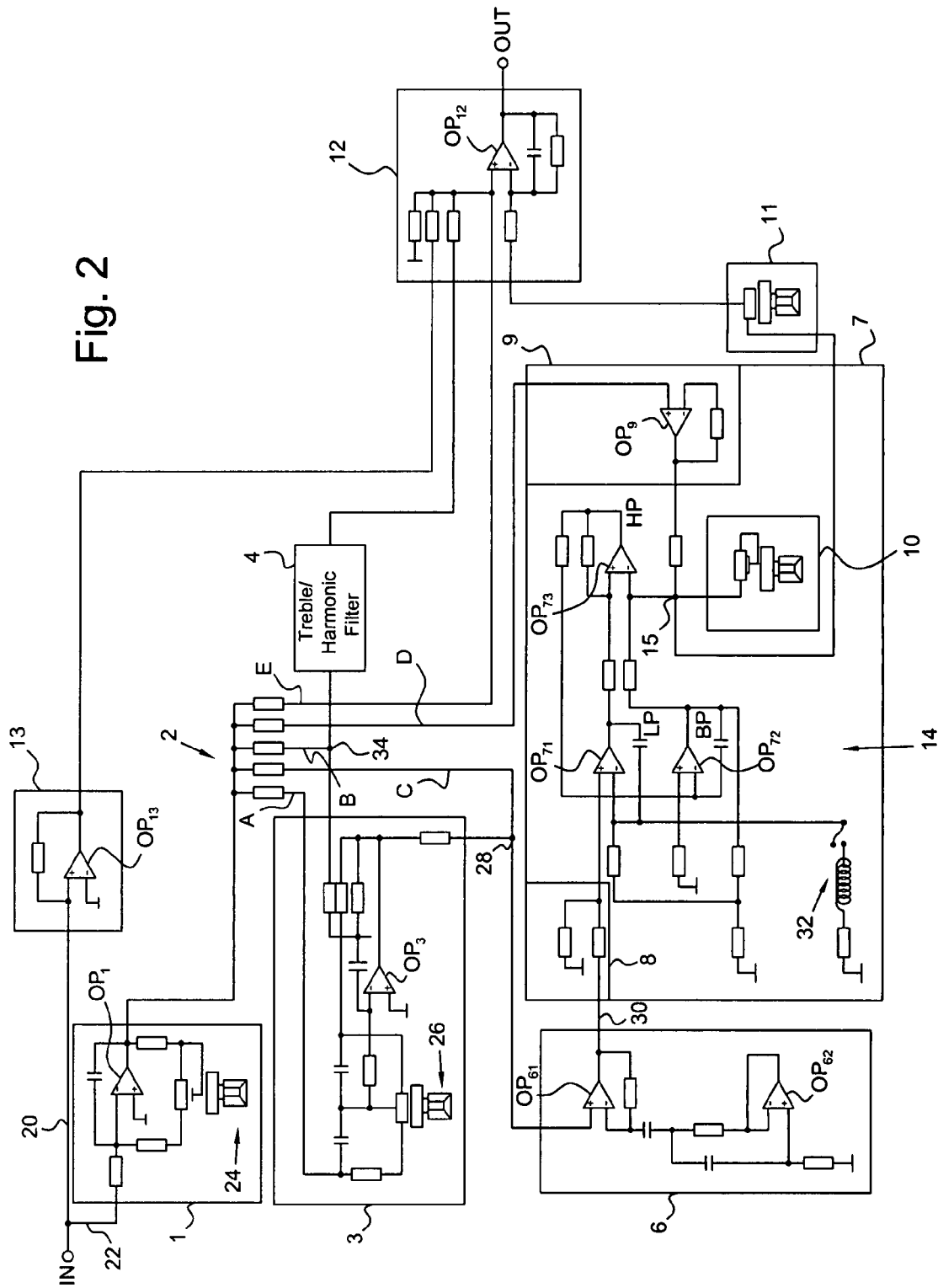
FIG. 2 shows a detailed circuit diagram of the inventive filter circuit.

FIG. 2 shows the same basic elements as the block diagram in FIG. 1, and these are denoted by the same reference symbols. They comprise the regulatable amplifier stage 1 at the input of the filter path 22, the resistor network 2, containing the resistors 2-A, 2-B, 2-C and 2-D and 2-E which set the weighting for the subsidiary paths, the control filter or area adjuster 3, the modified bandpass filter 6, the modified universal filter 7, the treble and harmonic filter 4 and the control 11 and also the driver stage 13 in the first or reference path 20 and the output summing stage 12.

The audio input signal in is supplied via the reference path 20 through the 1:1 driver stage 13, which has an operational amplifier $OP_{13}$, and via a resistor to the noninverting input of an operational amplifier $OP_{12}$, configured as an adder, in the output summing stage 12. The reference path 20 can optionally contain a switch (not shown) for interrupting the reference path 20. This means that only the filtered audio signal reaches the output summing stage 12 via the filter path 22. The unprocessed audio signal or reference signal can then be admixed with the filtered signal at another point.

The filter path 22 first passes through the regulatable amplifier stage 1, which has an operational amplifier $OP_1$ and also a control 24 which determines the actuation gain for the subsequent filter stages.

The output signal from the regulatable amplifier stage 1 is routed via the resistor network 2 to the various subsidiary parts A, B, C, D, E, with the resistors in the resistor network being able to have values in the range from 1 kΩ to 100 kΩ, for example. The resistor network 2 splits the second path or filter path 22 passively into five subsidiary parts, which are trimmed by means of series resistors in order to set the ratio thereof.

The first subsidiary path A is routed to the control filter 3, which is a modified active area adjuster which has fixed amplitude and frequency dimensions for a particular relatively high frequency range and, for a relatively low frequency range, has a fixed frequency setting and can have its amplitude varied using a control 26. The control filter 3 comprises the control 26 and also an operational amplifier $OP_3$ which, as shown in FIG. 2, are connected via resistors and capacitors. The operational amplifier $OP_3$ has feedback which comprises a resistor and a capacitor between the output and the inverting input of the operational amplifier $OP_3$, these being connected in series. At the junction between the resistor and the capacitor, there is a further resistor, which receives a portion of its control signal via the subsidiary path B. The control 26 is likewise connected to the inverting input of the operational amplifier $OP_3$ in order to set the variable bass amplitude.

The subsidiary path B also has a branch point 34 for branching the audio signal to the optional treble and harmonic filter 4. The output signal from the treble and harmonic filter 4 is connected to the noninverting input of the operational amplifier $OP_{12}$ in the output summing stage 12 via a resistor.

The output signal from the control filter 3 is routed via a resistor to a node 28 which also receives the audio signal via the subsidiary path C. This node 28 forms the input signal for the modified bandpass filter stage 6. The bandpass filter stage 6 has a first operational amplifier $OP_{61}$ and a second operational amplifier $OP_{62}$, which are connected by means of resistors and capacitors to form an active modified bandpass filter, as shown in FIG. 2. The input signal from the node 28 is routed to the noninverting input of the first operating amplifier $OP_{61}$ the modified active bandpass filter 6 being designed such that it acts like a frequency-dependent resistor to ground which reaches its maximum at a very low frequency, e.g. 50 Hz.

The audio signal which is passed through the control filter 3 and the active bandpass filter is applied to the control input of the modified universal filter 7. The control 26 in the control filter 3 and the summed bandpass filter 6 are able to be used to set desired bass timbres on the universal filter 7. The control 26 in the control filter 3 and the summed bandpass filter 6 are able to be used to influence the bass signal such that a largely unchanged bass signal, a very percussive, hard bass tone or a very soft, round bass tone is obtained. This is called setting the bass timbres.

The modified universal filter 7 has a first input stage with a voltage divider 8 which is formed from two resistors and is connected to a control input 30. The control input 30 receives the output signal from the modified bandpass filter 6. The input stage with the voltage divider is the core piece of the modified universal filter 7, or the universal filter core 14, connected downstream of it, this being formed from three operational amplifiers $OP_{71}$, $OP_{72}$ and $OP_{73}$ which are connected to resistors and capacitors as shown in figure 2. These operational amplifiers are connected differently than in the case of the universal filters known from the prior art, and also the modified bandpass filter 6 and the control filter or active area adjuster 3 are not connected as is customary in the prior art.

The inventors have found that modifying the filter circuits, as is shown in the figures and is described here, results in particularly advantageous filter properties in relation to timbre and frequency equalization.

In the universal filter core 14, the first operational amplifier $OP_{71}$ operates as a low-pass filter, the second operational amplifier $OP_{72}$ forms a bandpass filter, and the third operational amplifier $OP_{73}$ operates as a high pass filter, with the operational amplifiers forming a total of two integrators.

As compared with a "normal" universal filter, the universal filter in line with the invention has been modified such that the input circuitry for the low-pass filter, $OP_{71}$, does not correspond to that for an ordinary low-pass filter input and that also a second input of the universal filter 7 is provided via the second input stage 9. The bandpass filter, $OP_{72}$, is also not formed in the usual way, because it receives its input signal at the inverting input.

The summed output signal, routed via the voltage divider 8, from the control filter 3 and the modified bandpass filter 6 is applied to the noninverting input of the first operational amplifier $OP_{71}$, which operates as a low-pass filter. In summary, although the invention adopts the core elements of a universal filter, namely a low-pass filter, a high-pass filter and a bandpass filter, the actuation and logic combination thereof is changed.

In addition, the integration of controls and/or connectable inductances, as indicated at 32, at the inverting input of the operational amplifier $OP_{71}$ in the low-pass integrator allows provision to be made for further setting of the tonal filtering.

The modified universal filter 7 receives a second control signal via the subsidiary path D from the resistor network 2, this signal being routed to the noninverting input of an operational amplifier $OP_9$ in the amplifier stage 9. The output of the amplifier stage 9 is routed to a node 15 which is connected via a voltage divider to the noninverting input of the operational amplifier $OP_{73}$ in the high-pass filter. The node 15 also has a control 10 connected to it which can be used for individually setting the bandwidth which determines the frequency range for lowering and raising the mids/treble. The output signal from the active bandpass stage formed by the operational amplifier $OP_{72}$ is routed via the node 15 to a control 11 which can be used to connect the signal to the inverting input of the operational amplifier $OP_{12}$ in the output summing stage 12.

At this point, it is optionally possible to add further processing stages and functions, for example using a compressor/limiter, a time correction element or the like.

The precise distribution of the various filter output signals and of the reference signal over the inverting and noninverting inputs of the operational amplifier $OP_{12}$ in the output summing stage 12 results in interaction between frequency and phase of the audio signal at the output of the adder. This interaction, additionally extended by controls or switches in the individual filter stages, determines the overall frequency equalization of the inventive audio filter circuit.

Figure 3:
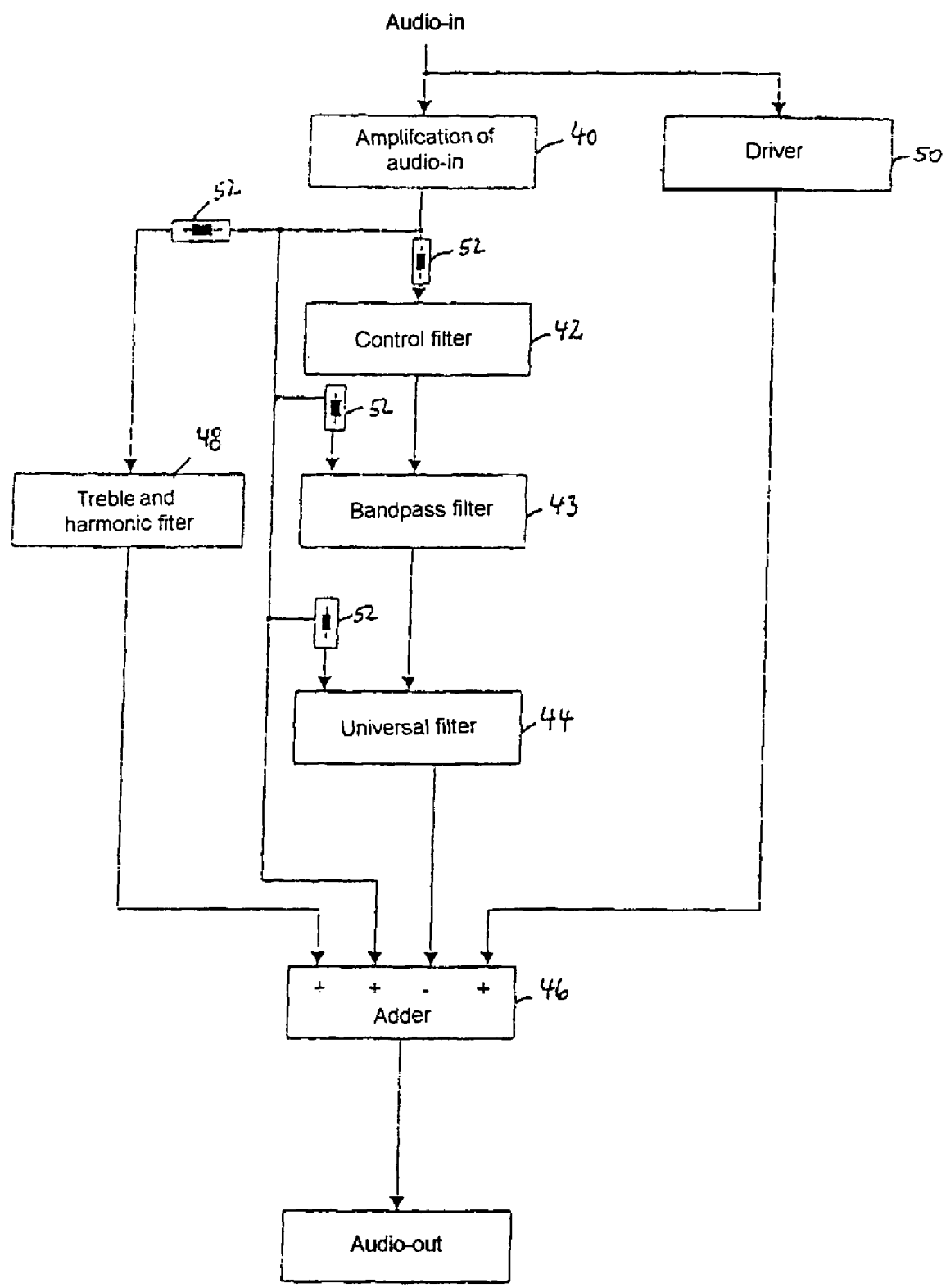
FIG. 3 shows a flowchart to explain the implementation of the inventive method in a computer program.

Finally, FIG. 3 schematically shows a flowchart illustrating how the inventive filter circuit can be implemented in a method or in a digital algorithm which can be implemented as a computer program. As FIG. 3 shows, the audio signal passes through an amplification stage 40, which can be implemented by multiplication by a setable coefficient. The amplified audio signal successively passes through a control filter function 42, a bandpass filter function 43 and a universal filter function 44 which respectively processed the signal in the manner prescribed by the circuits of the control filter 3, of the bandpass filter 6 and of the universal filter 7. The output signal from the universal filter 44 is input into an adder function 46. In addition, the amplified audio signal is branched off at the output of the amplification function 40 and is also directly input into the bandpass filter function 43, the universal filter function 44 and the adder function 46 as a control parameter. The amplified audio signal at the output of the amplifier function 40 is additionally input into a treble and harmonic filter function 48 whose output signal is likewise connected to the adder function 46. Finally, the essentially unchanged audio signal is also connected to the adder function 46 via a 1:1 driver function 50. The resistors shown in parallel with the respective signal paths indicate that the respective signals in the paths can be weighted (52) in line with the function of the resistor network 2. The individual function blocks provide the functions which are shown as circuit diagrams in FIG. 2. A person skilled in the art knows how to implement these functions in software.

The inventive filter method can be implemented as an algorithm in a computer program which can run on a personal computer, an all-purpose computer or a special computer or which can be integrated in a microprocessor for installation in units in consumer electronics, information technology or telecommunication technology. The filter circuit can be in the form of an analog circuit or an integrated semiconductor circuit, and the inventive filter circuit can also be implemented using a combination of hardware, firmware and/or software.

The features shown in the description above, in the claims and in the figures could be of significance both individually and in any desired combination for the purpose of realizing the invention in its various forms.

The invention claimed is:

1. A filter circuit for processing an audio signal comprising:
   a first path, in which the audio signal is routed essentially unchanged to an output summing stage, and
   a second path having a plurality of series-connected filter stages, where the audio signal is input into a first filter stage of the series-connected filter stages and is routed via the series-connected filter stages to the output summing stage, said plural filter stages comprising a control filter, a modified bandpass filter and a modified universal filter which are connected in series in this order,
   a third path having a plurality of auxiliary paths via which the audio signal is supplied directly to at least one other of the series-connected filter stages, wherein a first auxiliary path is supplied to said control filter, a second auxiliary path is combined with an output signal of said control filter, a third auxiliary path is supplied to said modified universal filter, and a fourth auxiliary path is supplied to said output summing stage, and
   where at least one of the filter stages is adjustable and the adjustment of one filter stage affects the operation of the at least one other of the series-connected filter stages.

2. The filter circuit as claimed in claim 1, characterized in that each of the filter stages receives the audio signal directly.

3. The filter circuit as claimed in claim 1, characterized in that the auxiliary paths have resistors for weighting the audio signal.

4. The filter circuit as claimed in claim 1, characterized in that the control filter is in the form of an active area adjuster which, in a first, relatively high frequency range, has a fixed adjustment for frequency and amplitude and, in a second, relatively low frequency range, has a fixed frequency adjustment and can be adjusted so as to vary the amplitude.

5. The filter circuit as claimed in claim 1, wherein said modified universal filter a universal filter core which comprises a low-pass filter ($OP_{71}$), a bandpass filter ($OP_{72}$) and a high-pass filter ($OP_{73}$).

6. The filter circuit as claimed in claim 5, characterized in that the universal filter core has three operational amplifiers ($OP_{71}$, $OP_{72}$, $OP_{73}$) arranged such that they form two integrators.

7. The filter circuit as claimed in claim 5, characterized in that the universal filter has the following features: a first input stage having a voltage divider, a second input stage having an input amplifier, the universal filter and a control, where the output of the first input stage forms the input signal for the low-pass filter ($OP_{71}$) in the universal filter core, the output signal from the second input stage forms the input signal for the high-pas filter ($OP_{73}$) in the universal filter core, and the control is connected to a node which is also connected to the input of the high-pass filter ($OP^{73}$), in the universal filter core, and where the node also forms the output of the universal filter.

8. The filter circuit in claim 1, characterized in that the second path has a regulatable amplifier connected upstream thereof.

9. The filter circuit as claimed in claim 1, characterized in that at least one of the plurality of auxiliary paths contains a treble and harmonic filter whose input receives the audio signal and whose output is connected to the output summing stage.

10. The filter circuit in claim 1, characterized in that the third path has a regulatable amplifier connected upstream thereof.

11. A method for processing an audio signal comprising the steps of:
   amplifying the audio signal,
   processing, the amplified audio signal using a first filter function in order to produce a first processed audio signal said first filter function providing control filtering,
   processing the amplified audio signal and the first processed audio signal using a second filter function in order to produce a second processed audio signal said second filter function providing bandpass filtering,
   processing the amplified audio signal and the second processed audio signal using a third filter function in order to produce a third processed audio signal filter function providing universal filtering, and
   summing the third processed audio signal, the amplified audio signal, and an essentially unprocessed audio signal in order to produce an audio output signal,
   where at least one of the filter functions is adjustable and the adjustment of one filter function affects another filter function.

12. The method as claimed in claim 11, characterized in that the amplified audio signal is weighted before it is supplied to the filter functions.

13. The method as claimed in claim 11, characterized in that the amplified audio signal is processed using a fourth filter function in order to produce a fourth processed audio signal, which is summed with the amplified audio signal, the third processed audio signal and the essentially unprocessed audio signal.

14. The method as claimed in claim 13, characterized in that the third processed audio signal is inverted before it is summed with the fourth processed audio signal, the amplified audio signal and the essentially unprocessed audio signal.

15. The method as claimed in claim 11, characterized in that the control filtering, in a first, relatively high frequency range, makes provision for fixed adjustment of frequency and amplitude and, in a second, relatively low frequency range, makes provision for fixed frequency adjustment and allows variable adjustment of the amplitude.

16. The method as claimed in claim 11, characterized in that the universal filtering comprises low-pass filtering, bandpass filtering and high-pass filtering.

17. The method as claimed in claim 16, characterized in that the universal filtering comprises integration and in that the frequency ranges for the loss-pass filtering, bandpass filtering and high-pas filtering are adjustable.

18. The method as claimed in claim 11, characterized in that a fourth filter function comprises treble and harmonic filtering.

19. A computer readable medium having a program code which executes the method claimed in claim 11.

20. A data storage medium having a computer program as claimed in claim 19 stored thereon.

21. The method as claimed in claim 11, characterized in that the signal is processed through the first filter function, the second filter function and the third filter function which are connected in series.

22. A filter circuit comprising:

a first path adaptable to receive an input audio signal in which the input audio signal is routed essentially unchanged to an output summing stage; and a second path adaptable to amplify said input audio signal and supply an amplified audio signal to a plurality of subsidiary paths, a first plural subsidiary path having a plurality of series-connected filter stages, where the amplified audio signal is input into a first filter stage of the series-connected filter stages and is routed via the series-connected filter stages to the output summing stage, said plural filter stages comprising a control filter, a modified bandpass filter and a modified universal filter which are connected in series in this order, a second plural subsidiary path supplied to said control filter, a third plural subsidiary path combined to an output of said control filter, a fourth plural subsidiary path supplied to said modified universal filter, and a fifth plural subsidiary path supplied to said output summing stage wherein at least one of the filter stages is adjustable and the adjustment of one filter stage affects the operation of the at least one other of the series-connected filter stages.

23. The filter circuit of claim 22 wherein said third plural subsidiary path is also supplied to a treble and harmonic filter that provides an input to said output summing stage.

* * * * *